United States Patent [19]

Rempfer et al.

[11] 4,096,386
[45] Jun. 20, 1978

[54] LIGHT REFLECTING ELECTROSTATIC ELECTRON LENS

[75] Inventors: Gertrude F. Rempfer, Forest Grove; George H. Lesch; Osbie Hayes Griffith, both of Eugene, all of Oreg.

[73] Assignee: Taylor-Kincaid Company, Eugene, Oreg.

[21] Appl. No.: 784,037

[22] Filed: Apr. 4, 1977

[51] Int. Cl.² .......................................... G01M 23/00
[52] U.S. Cl. .................................. 250/365; 250/311; 313/257
[58] Field of Search ....................... 250/311, 492, 365; 313/257

[56] References Cited

U.S. PATENT DOCUMENTS

| | | | |
|---|---|---|---|
| 2,313,018 | 3/1943 | Krause | 250/311 |
| 2,459,277 | 1/1949 | Halstead et al. | 313/257 |
| 2,551,542 | 5/1951 | Marsh et al. | 250/365 |
| 2,617,041 | 11/1952 | Fleming | 250/311 |
| 3,252,039 | 5/1966 | Claypool | 313/257 |
| 3,349,283 | 10/1967 | Krefft | 313/257 |

*Primary Examiner*—Harold A. Dixon
*Attorney, Agent, or Firm*—Klarquist, Sparkman, Campbell, Leigh, Hall & Whinston

[57] ABSTRACT

An improved electrostatic electron lens for photoelectron emission microscopes is disclosed, having a planar upper surface on its beam entrance electrode highly polished to a mirror finish for light reflection. The lens is positioned between a light source and a specimen holder such that light may be reflected off the planar upper surface of the entrance electrode onto the specimen for causing photoemission of electrons from such specimen. The lens is constructed to enable expansion of the lens electrodes during heating, such as "bake-out" to remove adsorbed gases, without breaking the insulators between such electrodes. An intermediate electrode is disposed in a spaced, insulated relationship between the beam entrance electrode and an exit electrode by two insulator members. This intermediate electrode is provided with an outer annular shoulder portion circumferentially disposed about its outer periphery cooperating in an abutting and overlapping relationship with an inner annular shoulder projection circumferentially disposed about one insulator, allowing the intermediate electrode to expand radially outward during heating without fracturing the insulators.

8 Claims, 5 Drawing Figures

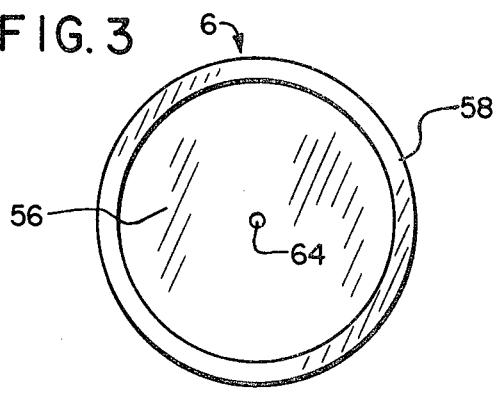
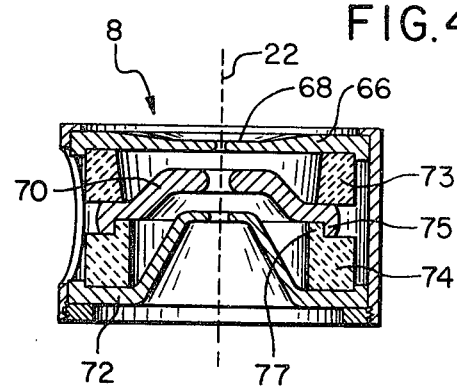
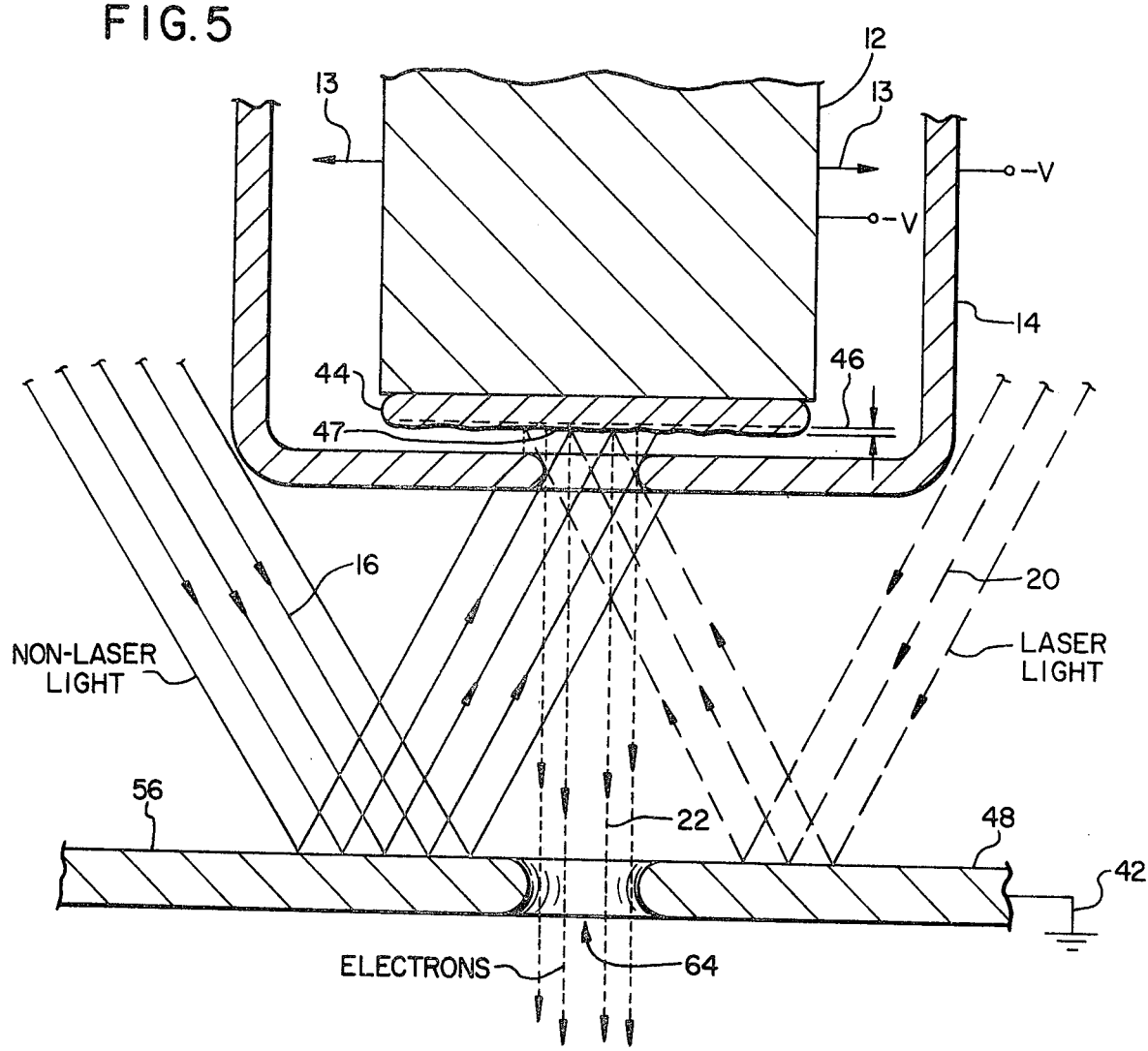

LIGHT REFLECTING ELECTROSTATIC ELECTRON LENS

BACKGROUND OF THE INVENTION

The subject matter of the present invention relates generally to improved electrostatic electron lenses, and in particular to improved electrostatic electron lenses to be utilized in electron beam devices including photoelectron microscopes.

In the operation of certain electron microscopes, such as photoelectron emission microscopes, also known as photoelectron microscopes, which may have magnification of 100X to 200,000X, it is necessary that the specimen, the lenses, and other parts be contained in a clean, ultra-high vacuum environment of, for example, from $10^{-9}$ to $10^{-11}$ Torr to avoid specimen contamination. As a result, the entire microscope must be heated before use and held at an elevated temperature sufficiently long to cause any adsorbed gases within the microscope apparatus to be released into the air which are then evacuated from the microscope leaving the interior cavity in a very clean and ultra-high vacuum condition. The temperature utilized may be from 150° C to 300° C. In the past, during this heating process, sometimes referred to as "bake-out", the electrodes of the electrostatic electron lenses would expand and fracture the insulators between such electrodes which constrained their movement, or such electrodes became physically distorted. This was costly and time consuming, inasmuch as the entire microscope system had to be disassembled and the damaged lens removed for repair before operation could resume.

Additionally, in a photoelectron microscope, the specimen to be observed must be illuminated with light, preferably ultraviolet, to cause the specimen to "photoemit" electrons. In the past, this proved to be a difficult task inasmuch as the light source was best disposed outside of the ultra-high vacuum environment to facilitate access to such source. Also, the specimen holder was, by necessity, positioned in a manner precluding a direct line of sight path between the light source and the specimen. This required that the light be reflected off an appropriate reflecting surface to illuminate the specimen. In known photoelectron microscopes, this has been accomplished in an expensive, inefficient manner by providing the microscope with a special mirror or reflecting surface separate from the electron lens and disposed within the microscope at an appropriate location to reflect light onto the specimen. Problems that are inherent in this past solution to the problem are an undesirably large spacing distance between the specimen and the lens, delicacy of alignment, extra cost and sensitivity to vibration, as well as inefficiency.

The improved electrostatic electron lens of the present invention is an improvement over my previous electron lenses, disclosed in U.S. Pat. No. 2,536,878, which issued Jan. 2, 1951 to Gertrude M. Fleming, and is entitled "ELECTRON LENS;" U.S. Pat. No. 2,740,919, which issued Apr. 3, 1956 to Gertrude M. Fleming and is entitled "ELECTRON LENS," and U.S. Pat. No. 3,253,144, which issued May 24, 1966 to Gertrude F. Rempfer, and is entitled "ELECTRON LENS HAVING MEANS FOR CORRECTING ASTIGMATISM." The present invention is also an improvement over my previous electron lenses utilized in my previous microscope disclosed in U.S. Pat. No. 2,617,041, which issued Nov. 4, 1952 to Gertrude M. Fleming and is entitled "STEREOSCOPIC ELECTRON MICROSCOPE." My previous electron lenses, as well as all of the known art of which I am aware, suffer from the difficulties of specimen illumination problems and lens insulator fracture as hereinbefore described.

In accordance with the present invention, a photoelectron microscope is described having an objective lens, and two projection lenses. These lenses are of the improved electrostatic electron type utilizing my present invention. The lenses focus the electrons emitted by the specimen into a beam and are aligned in axial alignment with one another allowing the electron beam to pass through their central apertures. The objective lens has its beam entrance electrode provided with a planar upper surface having a highly polished mirror finish and is disposed in spatial relationship below the specimen holder. This mirror surface reflects light from appropriate sources onto the specimen for photoemission, or allows visual observation of the specimen by the operator for specimen positioning. The intermediate electrode of each of the lenses is provided with an outer annular shoulder portion circumferentially disposed about its outer periphery, cooperating in an abutting overlapping relationship with an inner shoulder projection on one of the insulators, and disposed radially outward of such one insulator. This enables radial expansion of the intermediate electrode without fracturing the insulative support means or bending such electrode.

SUMMARY OF INVENTION

The primary object of the present invention is to provide an improved electrostatic electron lens.

Another primary object of the present invention is to provide an improved electrostatic electron lens for a photoelectron microscope.

A further object of the present invention is to provide an improved electrostatic electron lens which includes an entrance electrode having a planar, mirror surface.

Another object of the present invention is to provide an improved electrostatic electron lens which allows the electrodes to expand during heating without breaking their insulative support means or bending such electrodes.

Another object of the invention is to provide an improved electrostatic electron lens having a light reflecting surface on its entrance electrode which may be used in cooperation with a light source and a specimen holder in an electron microscope for reflecting light from the light source onto the specimen holder for the illumination of the specimen.

DRAWINGS

Other objects and advantages of the present invention will be apparent from the following detailed description of certain preferred embodiments thereof and from the attached drawings of which:

FIG. 3 is a top plan view of the objective electrostatic electron lens shown in FIG. 2;

FIG. 4 is a sectional view of an improved projection electrostatic electron lens utilizing the present invention; and FIG. 5 is an enlarged, broken sectional view of the specimen holder portion in cooperation with the upper surface of the objective electrostatic lens portion of the photoelectron microscope shown in FIG. 1.

DETAILED DESCRIPTION OF PREFERRED EMBODIMENT

Figure 1:
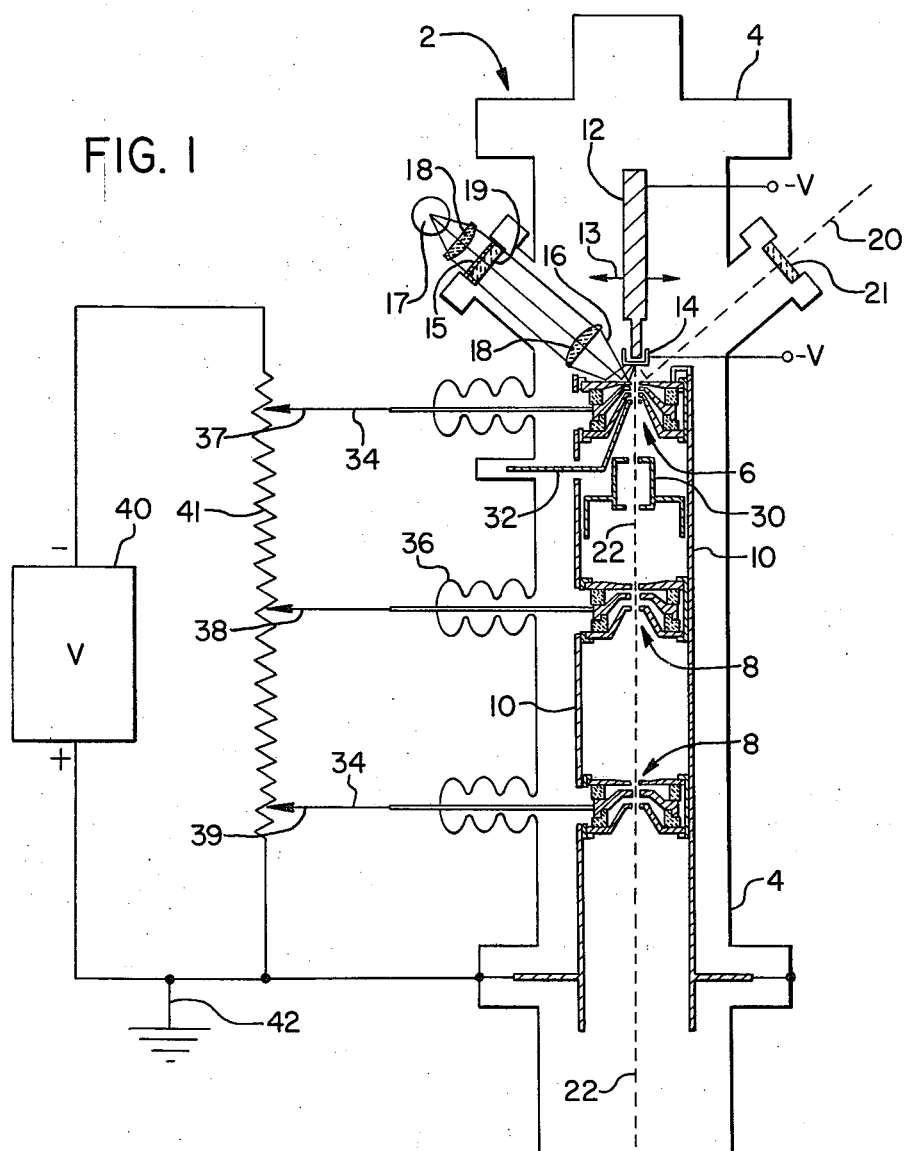
FIG. 1 is a schematic representation and partial section view of a photoelectron microscope which utilizes a preferred embodiment of the present invention.

A photoelectron microscope using electrostatic lenses in accordance with a preferred embodiment of the present invention is shown in FIG. 1. It is to be understood that the lenses of the present invention may be utilized in various other charged particle beam devices, and are not limited to use in electron microscopes.

The photoelectron microscope 2 of the type utilizing the lenses of the present invention comprises a metal housing 4 in which is enclosed an objective electrostatic electron lens 6 and a pair of projection electrostatic electron lenses 8. The lenses are held rigidly in position by a metal lens tube 10 such that the lenses are disposed in axial alignment with one another within a central portion of the microscope. An ultra-high vacuum is provided within the microscope which may be from $10^{-9}$ to $10^{-11}$ Torr.

Also enclosed in the housing is a removable specimen holder 12 which is laterally adjustable as indicated by arrows 13 for positioning the selected portion of the specimen to be observed which is attached to the lower end of the specimen holder. A metal specimen holder cup 14 is fixedly supported by a plurality of insulative supports (not shown) to the lens tube, below and in close proximity to the specimen, such cup having a central aperture in alignment with the common axis of the electrostatic electron lenses. Rays of light 16 emitted by a light source 17 outside of the microscope housing 4 are transmitted through a filter 15 and first lens 18 external to the housing and then through a window 19 and a second lens 18 inside the housing. The light rays 16 are focused by means of light lenses 18 onto the entrance electrode of the objective lens 6 which reflects such light through the central aperture of the specimen holder cup 14 and onto the specimen disposed on the tip of specimen holder 12 as hereafter discussed in reference to FIG. 5. This light may be visible or invisible but is preferably ultraviolet for photoemission of electrons from the specimen. Alternatively, a laser beam 20 of high intensity coherent light may be transmitted from an appropriate laser source (not shown) through another window 21 in the housing and onto the objective lens 6 in the same manner, to illuminate the specimen.

The specimen, being thus illuminated with a light of sufficient intensity, is caused to "photo-emit" electrons which are then focused by the electron lenses into an electron beam 22. The electron beam is focused onto a phosphor screen 24 for direct image observation or for directing a light image onto a photocathode 25 of an electronic light image intensifier or amplifier 27 whose output phosphor screen 26 is photographed by camera 28.

Figure 2:
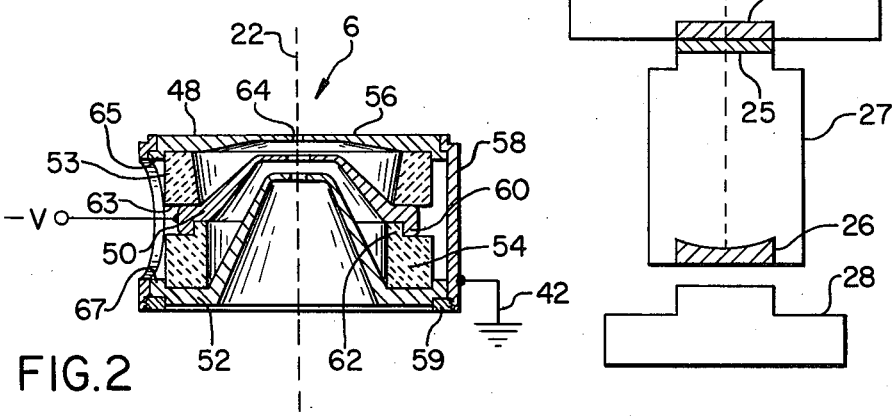
FIG. 2 is a sectional view of an improved objective electrostatic electron lens utilizing the present invention.

Referring now to FIG. 2, the objective electrostatic electron lens 6 is comprised of a beam entrance electrode 48, an intermediate electrode 50, and a beam exit electrode 52, each held in spaced, insulated relationship to one another by two insulator members 53 and 54. It is to be understood that the electrodes may be of a generally circular cup shape, with their central apertures positioned in axial alignment by the insulators 53 and 54 so as to allow the passage of the electron beam 22 therethrough.

The entrance electrode 48 has an upper surface 56 which is of a planar, light reflective nature, being accurately machined and highly polished to a mirror finish so that it can reflect a light image. The mirror surface 56 is employed to reflect light onto the specimen and to allow optical observation of the specimen. This mirror finish may be 10–20 microinches. It is to be understood that this measurement is the vertical depth between ridges and grooves left in the surface during lathe machining but also may be nearly equal in magnitude to the horizontal distance between successive grooves on the surface due to the type of cutting tool used to machine such surface. This measurement of finish is sometimes referred to in the art as "machining groove." The electrodes may be made of either a stainless steel, brass, or other electrically conductive material, as desired. The insulative supports 53 and 54 may be of a ceramic, machinable-glass material or synthetic plastic under some circumstances, with the proper electrical properties. It is to be understood that the entrance electrode 48 and the exit electrode 52 are maintained at ground potential by electrical connection with the lens tube through support sleeve 58. The support sleeve 58 and a closure ring 59 threaded into the bottom end of such sleeve holds the lens electrodes 48, 50 and 52 and the insulators 53 and 54 in fixed axial alignment. The intermediate electrode 50 is supplied with a high negative D.C. voltage ($-V$) through connection to the voltage contact 34 of FIG. 1.

In order to solve the insulator cracking problem mentioned above, the lens electrodes are supported in a new way. The intermediate electrode 50 of the objective lens 6 of FIGS. 2 and 3 has an annular outer shoulder portion 60 circumferentially disposed about its periphery and cooperating in an abutting and overlapping relationship with an annular inner shoulder projection 62 on insulator 54. The inner shoulder projection 62 is disposed on the top portion of the lower insulator 54 and positioned radially inward of the outer shoulder portion 60. The upper insulator 53 is provided with a flat bottom surface 63 which engages the flat top of the outer flange portion of the intermediate electrode. It is to be understood that the cooperation of the intermediate electrode 50 with the insulators 53 and 54 through the flat surface 63 of insulator 53 and the overlapping and abutting relationship of the shoulder portion 60 and the shoulder projection 62 allows the intermediate electrode 50 to radially expand outward during the heating or "bake-out" without fracturing or cracking the insulator and without bending the electrode. The same is true of the entrance electrode 48 and the exit electrode 52 whose outer shoulders 65 and 67, respectively, surround insulators 53 and 54 and radially expand outward without breaking the insulators. Temperatures used for this bake-out process may be from 150° C to 300° C and are held for sufficient time to remove gases absorbed in the electrodes and other metal parts. Thus, design of lens 6 is such that insulators and the electrodes support each other to hold the electrodes in rigid and accurate alignment and spacing with respect to one another while enabling them to expand during the bake-out process without fracturing the support means.

Astigmatism, which is inherently present in an electrostatic lens system of this type, is controlled through the use of a known stigmator component 30 through which the electron beam 22 passes, as shown in FIG. 1.

An aperture stop 32 is adjusted in spacing relative to the exit electrode of the objective lens 6 to control the diameter of the electron beam.

The electrostatic electron lenses as hereinbefore described are supplied with a high D.C. voltage through voltage contacts 34 electrically connected to the intermediate electrode of each lens in a manner later described, and insulated from the housing 4 by high voltage insulators 36. The voltage contacts 34 are adjustably energized by connection to one of three movable contacts 37, 38 and 39 which are movable along a voltage divider resistor 41 between a D.C. voltage source 40 and ground 42. The high voltage D.C. source may generate thirty kilovolts at a negative output terminal. It will be seen that the positive terminal of voltage source 40, together with the housing 4 of the microscope and the lower end of the voltage divider network are connected to a ground 42. It will also be noted that the lens tube 10 together with the entrance and exit electrodes of the electrostatic electron lenses 6 and 8 are also connected to ground 42 through electrical connections to the housing 4.

The overall operation of the photoelectron microscope of the type depicted in FIG. 1 is best understood by reference to FIG. 5. A specimen 44 attached to the specimen holder 12 is flooded with non-laser light rays 16, or, alternatively, laser light rays 20, by reflecting the light rays off of the planar, highly polished mirror surface 56 on the entrance electrode 48 of the objective lens 6. The electrons in the atoms in a surface layer of the specimen, which are within a certain distance 46 from the irradiated surface, are excited to a photoemission condition such that the valence electrons of the atoms leave the surface of the specimen. This distance or thickness 46 is referred to as "escape depth." The aperture in specimen holder cup 14 serves to restrict the light reaching the specimen to a desirable area 47 such as a spot 1.5 mm in diameter and also restricts the diameter of the electron beam 22. The specimen holder is laterally adjustable as indicated by the arrows 13 allowing different selected portions of the specimen to be illuminated with the spot of light as desired. The specimen holder 12 and holder cup 14 are held at a high negative D.C. voltage level (−V) such as −30 KV. The entrance electrode 48 of the objective lens 6 is grounded. Therefore, the electrons move in a downward direction (from the specimen 44 toward the entrance electrode 48) passing through the aperture 64 of the entrance electrode, forming the electron beam 22. The beam 22 is focused and enlarged by the electrostatic electron lenses 6 and 8 which are the subject matter of the present invention.

It is to be understood that photoelectron microscopy is a known art, as shown in *Proceedings of National Academy of Science, U.S.A.*, Vol. 69, No. 3, pps. 561–565 (1972). The presentation of the general configuration of a microscope of this type is included in FIG. 1 merely to facilitate an understanding of a preferred utilization of my present invention.

The projection lens 8 as shown in FIG. 4, has a beam entrance electrode 66 with its upper surface 68 dished downward and such upper surface is not planar nor provided with a mirror finish for light reflection as is the upper surface 56 of the entrance electrode 48 of the objective lens 6 before described. The intermediate electrode 70 and the exit electrode 72 of the projection lens 8 are similar, though not identical, in shape to the corresponding electrodes 50 and 52 of the objective lens 6 shown in FIG. 2. The two insulators 73 and 74 of the projection lens 8 are likewise similar to the insulators 53 and 54 of the objective lens and serve the same function and purposes as hereinbefore described for insulators 53 and 54. Therefore, the intermediate electrode 70 is allowed to expand radially outward during heating without fracturing the insulator 74 because of their overlapping shoulder portions 75 and 77 corresponding to shoulder portions 60 and 62 of the objective lens 6. Also, the entrance electrode 66 and exit electrode 72 are supported like their corresponding electrodes 48 and 52, allowing non-destructive radial expansion during heating.

It will be obvious to those having ordinary skill in the art that the preferred embodiment of my improved electrostatic electron lens may be altered without departing from the spirit of my invention. Also, while one objective lens and two projection lenses are shown in my preferred embodiment in FIG. 1 giving magnification power of up to 10,000X, it is to be understood that more lenses may be utilized as desired depending upon the desired magnification level and other physical constraints of the microscope system. For example, using four lenses may cause magnification of up to 200,000X. Therefore, the scope of the present invention should only be determined by the following claims.

We claim:

1. An electrostatic electron lens apparatus comprising:
    a plurality of electrically conductive electrodes including an entrance electrode, an exit electrode and an intermediate electrode disposed between said entrance and exit electrodes;
    insulative support means for mounting said electrodes with their apertures in alignment and for spacing and insulating said intermediate electrode from said entrance electrode and said exit electrode; and
    said entrance electrode having a substantially planar, front surface with a mirror finish for reflection of light away from the lens to a specimen positioned in front of said lens.

2. Lens apparatus in accordance with claim 1 wherein said front surface of said entrance electrode has a mirror finish of 20 micro-inches or less.

3. Lens apparatus in accordance with claim 1 in combination with specimen holder means for receiving and holding a specimen to be illuminated with light; and
    light source means positioned so as to reflect light from said front surface of said entrance electrode and to said specimen holder means.

4. Lens apparatus in accordance with claim 1 wherein said insulative support means has electrode engaging surfaces disposed radially inward of shoulders on the outer periphery of said electrodes to maintain said spacing and alignment while enabling said electrodes to expand during heating without breaking said support means.

5. Lens apparatus in accordance with claim 1 wherein said intermediate electrode includes:
    a shoulder portion disposed about the periphery of said intermediate electrode, and abutting an electrode engaging projection on said insulative support means with the inner surface of said shoulder portion while the outer surface of said shoulder portion is spaced from contact with said insulative support means to enable outward expansion of said intermediate electrode.

6. Lens apparatus in accordance with claim 5 in combination with specimen holder means for receiving and holding a specimen to be illuminated with light; and light source means positioned so as to reflect light off of said planar reflective front surface of said entrance electrode and onto said specimen holder means.

7. A photoelectron emission microscope in which the improvement comprises:

a plurality of electrically conductive electrodes including an entrance electrode, an exit electrode and an intermediate electrode disposed between said entrance and exit electrodes, each of said electrodes having an aperture for the passage of electrons through said electrodes;

insulative support means for mounting said electrodes with their apertures in alignment and for spacing and insulating said intermediate electrode from said entrance electrode and said exit electrode; and said entrance electrode having a substantially planar front surface with a mirror finish for reflection of light away from the lens to a specimen positioned in front of said lens.

8. A microscope in accordance with claim 7 in which said front surface of said entrance electrode has a mirror finish of 20 micro-inches or less.

* * * * *